(12) United States Patent
Schaller et al.

(10) Patent No.: US 11,574,826 B2
(45) Date of Patent: Feb. 7, 2023

(54) HIGH-DENSITY SUBSTRATE PROCESSING SYSTEMS AND METHODS

(71) Applicant: Applied Materials, Inc., Santa Clara, CA (US)

(72) Inventors: Jason M. Schaller, Austin, TX (US); Steve Hongkham, San Ramon, CA (US); Charles T. Carlson, Austin, TX (US); Tuan A. Nguyen, San Jose, CA (US); Swaminathan T. Srinivasan, Pleasanton, CA (US); Khokan Chandra Paul, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/922,874

(22) Filed: Jul. 7, 2020

(65) Prior Publication Data

US 2021/0013055 A1 Jan. 14, 2021

Related U.S. Application Data

(60) Provisional application No. 62/873,503, filed on Jul. 12, 2019.

(51) Int. Cl.
*H01L 21/67* (2006.01)
*H01L 21/687* (2006.01)

(52) U.S. Cl.
CPC .... *H01L 21/6719* (2013.01); *H01L 21/67167* (2013.01); *H01L 21/68707* (2013.01); *H01L 21/68742* (2013.01)

(58) Field of Classification Search
CPC ........... H01L 21/6719; H01L 21/67167; H01L 21/68707; H01L 21/68742;

(Continued)

(56) References Cited

U.S. PATENT DOCUMENTS

| 5,513,948 A | 5/1996 | Bacchi et al. |
| 5,667,592 A | 9/1997 | Boitnott et al. |

(Continued)

FOREIGN PATENT DOCUMENTS

| CN | 1909182 A | 2/2007 |
| CN | 101835922 A | 9/2010 |

(Continued)

OTHER PUBLICATIONS

International Preliminary Report on Patentability dated Jan. 27, 2022 in International Patent Application No. PCT/US2020/041157, 9 pages.

(Continued)

*Primary Examiner* — Mohammed Shamsuzzaman
(74) *Attorney, Agent, or Firm* — Kilpatrick Townsend & Stockton LLP

(57) ABSTRACT

Exemplary substrate processing systems may include a factory interface and a load lock coupled with the factory interface. The systems may include a transfer chamber coupled with the load lock. The transfer chamber may include a robot configured to retrieve substrates from the load lock. The systems may include a chamber system positioned adjacent and coupled with the transfer chamber. The chamber system may include a transfer region laterally accessible to the robot. The transfer region may include a plurality of substrate supports disposed about the transfer region. Each substrate support of the plurality of substrate supports may be vertically translatable. The transfer region may also include a transfer apparatus rotatable about a central axis and configured to engage substrates and transfer substrates among the plurality of substrate supports. The chamber system may also include a plurality of processing regions vertically offset and axially aligned with an associated substrate support.

14 Claims, 10 Drawing Sheets

(58) Field of Classification Search
CPC ......... H01L 21/67161; H01L 21/67184; H01L 21/67196; H01L 21/67742; H01L 21/67748; H01L 21/68771
See application file for complete search history.

(56) References Cited

U.S. PATENT DOCUMENTS

| | | | |
|---|---|---|---|
| 5,855,465 A | 1/1999 | Boitnott et al. | |
| 6,293,746 B1 | 9/2001 | Ogawa | |
| 6,962,644 B2 | 11/2005 | Paterson et al. | |
| 7,516,833 B2 | 4/2009 | Todaka | |
| 8,033,769 B2 | 10/2011 | Gage et al. | |
| 8,336,488 B2 * | 12/2012 | Chen | H01J 37/32449 156/345.55 |
| 9,184,072 B2 | 11/2015 | Devine et al. | |
| 9,299,598 B2 | 3/2016 | Blank | |
| 9,449,795 B2 * | 9/2016 | Sabri | C23C 16/509 |
| 9,484,233 B2 * | 11/2016 | Leeser | H01L 21/67109 |
| 9,842,757 B2 | 12/2017 | Hosek et al. | |
| 10,109,517 B1 * | 10/2018 | Blank | H01L 21/68764 |
| 10,128,134 B2 * | 11/2018 | Kondoh | H01L 21/67745 |
| 10,224,182 B2 * | 3/2019 | Keil | H01J 37/3255 |
| 10,347,515 B2 * | 7/2019 | Heinz | H01L 21/67751 |
| 10,363,665 B2 | 7/2019 | Hosek et al. | |
| 11,117,265 B2 * | 9/2021 | Wirth | H01L 21/68792 |
| 11,355,367 B2 * | 6/2022 | Schaller | H01L 21/68707 |
| 2003/0082042 A1 | 5/2003 | Woodruff et al. | |
| 2003/0113187 A1 * | 6/2003 | Lei | H01L 21/67742 414/217 |
| 2004/0127142 A1 | 7/2004 | Olgado | |
| 2005/0031497 A1 | 2/2005 | Siebert et al. | |
| 2007/0031236 A1 * | 2/2007 | Chen | H01L 21/6719 414/935 |
| 2007/0034479 A1 * | 2/2007 | Todaka | H01L 21/6719 414/941 |
| 2007/0207014 A1 | 9/2007 | Toshima | |
| 2008/0000422 A1 | 1/2008 | Park et al. | |
| 2010/0294199 A1 * | 11/2010 | Tran | H01L 21/68785 118/723 R |
| 2012/0063874 A1 * | 3/2012 | Kremerman | B25J 9/043 414/744.3 |
| 2013/0059440 A1 | 3/2013 | Wang | |
| 2013/0269609 A1 | 10/2013 | Leeser | |
| 2014/0010625 A1 * | 1/2014 | Hudgens | B25J 9/104 901/14 |
| 2014/0154038 A1 | 6/2014 | Hudgens et al. | |
| 2014/0265090 A1 | 9/2014 | Hou | |
| 2015/0063957 A1 * | 3/2015 | Olgado | H01L 21/68742 414/226.05 |
| 2016/0289838 A1 | 10/2016 | Bansal et al. | |
| 2016/0307782 A1 | 10/2016 | Weaver et al. | |
| 2016/0355927 A1 | 12/2016 | Weaver et al. | |
| 2017/0040203 A1 | 2/2017 | Caveney et al. | |
| 2017/0040204 A1 | 2/2017 | Kim et al. | |
| 2017/0306493 A1 | 10/2017 | Raj et al. | |
| 2018/0286728 A1 | 10/2018 | Moura et al. | |
| 2019/0164790 A1 | 5/2019 | Liu | |
| 2019/0355605 A1 * | 11/2019 | Hudgens | H01L 21/67742 |
| 2020/0094399 A1 | 3/2020 | Shindo et al. | |
| 2020/0402827 A1 | 12/2020 | Uziel et al. | |
| 2021/0013068 A1 | 1/2021 | Schaller et al. | |
| 2021/0335635 A1 | 10/2021 | Kalsekar | |

FOREIGN PATENT DOCUMENTS

| | | |
|---|---|---|
| CN | 107342243 A | 11/2017 |
| JP | H11-163075 A | 6/1999 |
| JP | 2007-049157 A | 2/2007 |
| JP | 4951201 B2 | 6/2012 |
| JP | 5463367 B2 | 4/2014 |
| KR | 10-0376963 B1 | 3/2003 |
| KR | 2007-0053538 A | 5/2007 |
| KR | 101394111 B1 | 5/2014 |
| KR | 2015-0101785 A | 9/2015 |
| KR | 10-1715887 B1 | 3/2017 |
| KR | 2019-0074481 A | 6/2019 |
| TW | 2011-45448 A | 12/2011 |
| TW | 201624599 A | 7/2016 |

OTHER PUBLICATIONS

International Search Report and Written Opinion dated Oct. 29, 2020 in International Patent Application No. PCT/US2020/041157, 11 pages.

International Search Report and Written Opinion mailed in International Patent Application No. PCT/US2020/040994, 10 pages.

International Search Report and Written Opinion dated Oct. 20, 2020 in International Patent Application No. PCT/US2020/041015, 11 pages.

International Search Report and Written Opinion dated Oct. 13, 2020 in International Patent Application No. PCT/US2020/041103, 7 pages.

International Search Report and Written Opinion dated Oct. 29, 2020 in International Patent Application No. PCT/US2020/041202, 10 pages.

International Search Report and Written Opinion dated Oct. 23, 2020 in International Patent Application No. PCT/US2020/041156, 9 pages.

* cited by examiner

HIGH-DENSITY SUBSTRATE PROCESSING SYSTEMS AND METHODS

CROSS-REFERENCES TO RELATED APPLICATIONS

This application claims the benefit of priority of U.S. Provisional Patent Application No. 62/873,503, filed 12 Jul. 2019, the content of which is hereby incorporated by reference in its entirety for all purposes. The present technology is further related to the following applications, all concurrently filed 12 Jul. 2019, and titled: "ROBOT FOR SIMULTANEOUS SUBSTRATE TRANSFER" (U.S. Provisional Patent Application No. 62/873,400), "ROBOT FOR SIMULTANEOUS SUBSTRATE TRANSFER" (U.S. Provisional Patent Application No. 62/873,432), "ROBOT FOR SIMULTANEOUS SUBSTRATE TRANSFER" (U.S. Provisional Patent Application No. 62/873,458), "ROBOT FOR SIMULTANEOUS SUBSTRATE TRANSFER" (U.S. Provisional Patent Application No. 62/873,480), and "MULTI-LID STRUCTURE FOR SEMICONDUCTOR PROCESSING SYSTEMS" (U.S. Provisional Patent Application No. 62/873,518). Each of these applications is hereby incorporated by reference in their entirety for all purposes.

TECHNICAL FIELD

The present technology relates to semiconductor processes and equipment. More specifically, the present technology relates to substrate processing systems and methods of substrate processing.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate.

Thus, there is a need for improved systems and methods that can be used to efficiently direct substrates within cluster tool environments. These and other needs are addressed by the present technology.

SUMMARY

Exemplary substrate processing systems may include a factory interface and a load lock coupled with the factory interface. The systems may include a transfer chamber coupled with the load lock. The transfer chamber may include a robot configured to retrieve substrates from the load lock. The systems may include a chamber system positioned adjacent and coupled with the transfer chamber. The chamber system may include a transfer region laterally accessible to the robot. The transfer region may include a plurality of substrate supports disposed about the transfer region. Each substrate support of the plurality of substrate supports may be vertically translatable along a central axis of the substrate support between a first position and a second position. The transfer region may also include a transfer apparatus rotatable about a central axis and configured to engage substrates and transfer substrates among the plurality of substrate supports. The chamber system may also include a plurality of processing regions vertically offset from the transfer region. Each processing region of the plurality of processing regions may be axially aligned with an associated substrate support of the plurality of substrate supports. Each processing region may be defined from below by an associated substrate support in the second position.

In some embodiments, the plurality of substrate supports within the transfer region of the chamber system may include at least four substrate supports. Each processing region of the plurality of processing regions may be fluidly coupled with the transfer region and fluidly isolated from above from each other processing region of the plurality of processing regions. The systems may include at least two additional chamber systems positioned adjacent and coupled with the transfer chamber. Each chamber system may define two accesses along a surface of a housing of the transfer region adjacent the transfer chamber. A first access of the two accesses is aligned with a first substrate support of the plurality of substrate supports. A second access of the two accesses may be aligned with a second substrate support of the plurality of substrate supports. The robot may include two arms configured to deliver or retrieve a first substrate from the first substrate support through the first access and simultaneously deliver or retrieve a second substrate from the second substrate support through the second access. The systems may include at least three additional chamber systems positioned adjacent and coupled with the transfer chamber. Each chamber system may define one access along a surface of a housing of the transfer region adjacent the transfer chamber. The one access may be aligned with a first substrate support of the plurality of substrate supports. The robot may include one arm configured to deliver or retrieve a substrate from the first substrate support through the one access. The one arm of the robot may extend through the one access of each chamber system at an angle other than perpendicular to the one access.

Some embodiments of the present technology may encompass methods of processing a substrate within a substrate processing system. The methods may include delivering, with a transfer chamber robot, a substrate to a first substrate support within a transfer region of a chamber system. The methods may include engaging the substrate at the first substrate support with a transfer apparatus housed within the transfer region of the chamber system. The methods may include transferring, with the transfer apparatus, the substrate to a second substrate support within the transfer region of the chamber system. The methods may include raising the substrate with the second substrate support along a central axis of the second substrate support to a first processing region overlying the transfer region. The second substrate support may at least partially define the first processing region from below. The methods may also include processing the substrate within the first processing region.

In some embodiments, engaging the substrate with the transfer apparatus may include engaging at least three substrates with the transfer apparatus. Transferring the substrate may include transferring the at least three substrates with the transfer apparatus to at least three other substrate supports within the transfer region. Processing the substrate may include depositing one or more layers of material on the substrate. The methods may also include lowering the substrate with the second substrate support to a position within the transfer region accessible by the transfer apparatus. The methods may include engaging the substrate at the second substrate support with the transfer apparatus. The methods may include transferring, with the transfer apparatus, the substrate to a third substrate support within the transfer region of the chamber system. The methods may include raising the substrate with the third substrate support along a central axis of the second substrate support to a second processing region overlying the transfer region. The third substrate support may at least partially define the second processing region from below.

The methods may include depositing an additional one or more layers of material on the substrate. The second processing region may be fluidly isolated from above from the first processing region. The transfer apparatus may be rotatable about a central axis and configured to engage substrates and transfer substrates among a plurality of substrate supports within the transfer region. The chamber system may include a plurality of substrate supports disposed about the transfer region of the chamber system. Each substrate support of the plurality of substrate supports may be vertically translatable along a central axis of the substrate support between a first position and a second position. The chamber system may include a plurality of processing regions vertically offset from the transfer region of the chamber system. Each processing region of the plurality of processing regions may be axially aligned with an associated substrate support of the plurality of substrate supports. A processing region may be defined from below by an associated substrate support in the second position. Transfer chamber robot may be housed in a transfer chamber adjacent to the chamber system.

Some embodiments of the present technology may encompass chamber systems including a transfer region. A housing of the transfer region may define at least one access for delivery or retrieval of a substrate. The transfer region may include a plurality of substrate supports disposed about the transfer region. Each substrate support of the plurality of substrate supports may be vertically translatable along a central axis of the substrate support between a first position and a second position. The systems may include a transfer apparatus within the transfer region. The transfer apparatus may be rotatable about a central axis and configured to engage substrates and transfer substrates among the plurality of substrate supports. The systems may also include a plurality of processing regions vertically offset from the transfer region. Each processing region of the plurality of processing regions may be axially aligned with an associated substrate support of the plurality of substrate supports. A processing region may be defined from below by an associated substrate support in the second position.

Such technology may provide numerous benefits over conventional systems and techniques. For example, the processing systems may provide multi-substrate processing capabilities that may be scaled well beyond conventional designs within economical footprints. Additionally, each chamber system may afford multi-substrate processing as well as transfer apparatuses that may reduce processing times. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
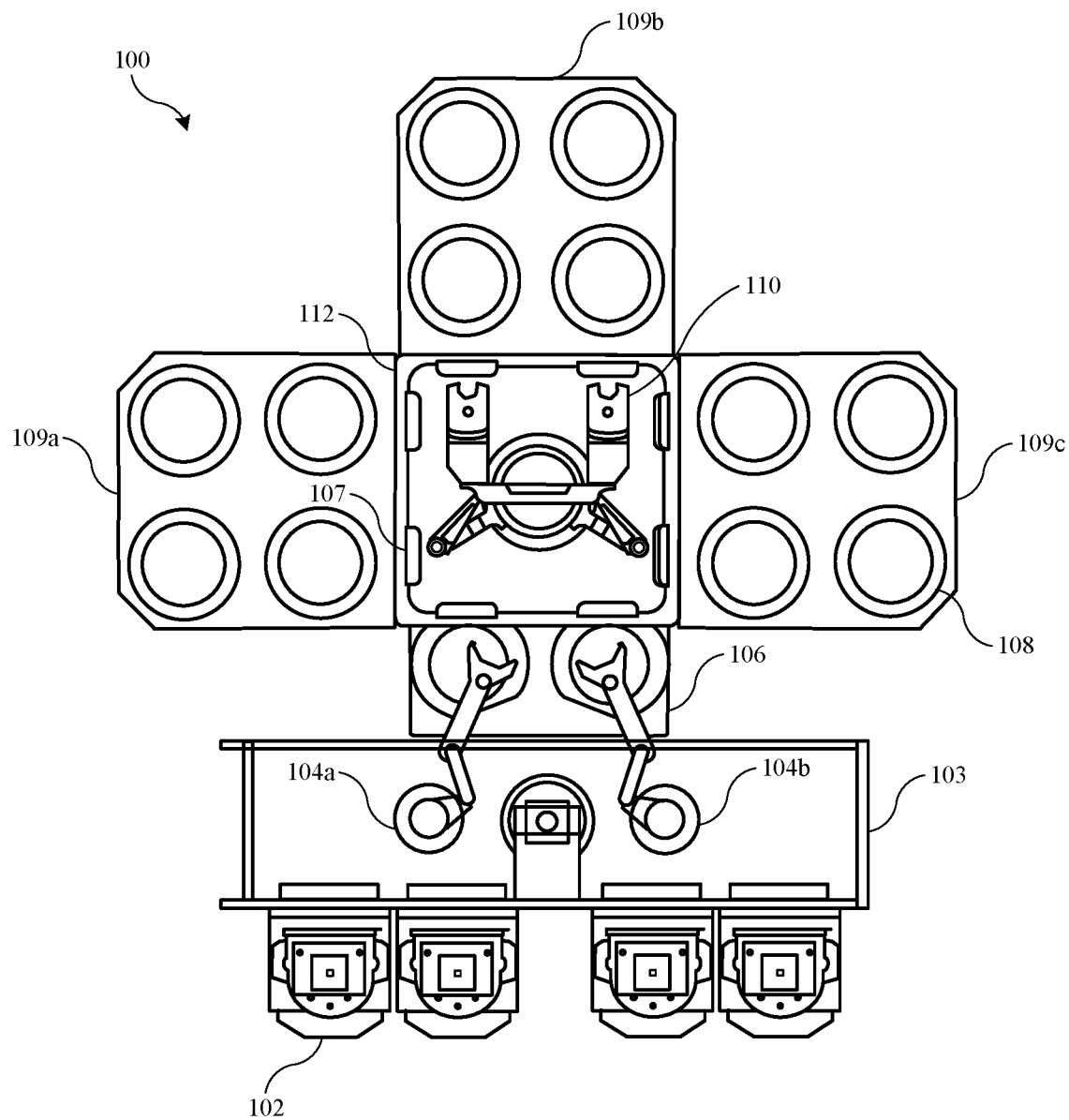
FIG. 1A shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region. Although the remaining disclosure will routinely identify specific structures, such as four-position transfer regions, for which the present structures and methods may be employed, it will be readily understood that the systems and methods are equally applicable to any number of structures and devices that may benefit from the transfer capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104*a* and 104*b* and placed into a load lock or low pressure holding area 106 before being delivered to one of the substrate processing regions 108, positioned in chamber systems or quad sections 109*a-c*, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109*a* and 109*b*, may be used to deposit material on the substrate, and the third set of processing chambers, such as the processing chambers or regions in quad section 109*c*, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
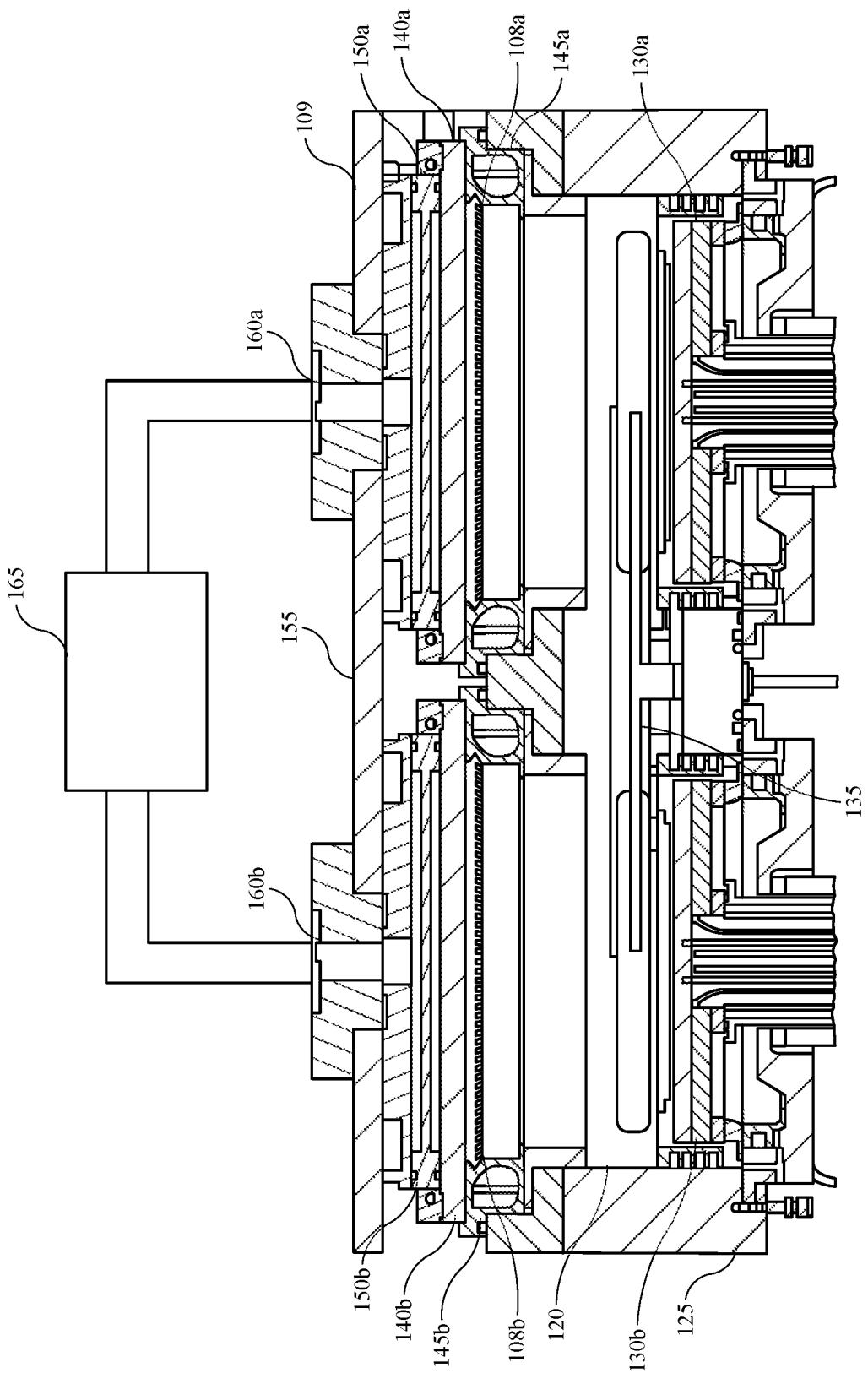
FIG. 1B shows a schematic partial cross-sectional view of an exemplary chamber system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. In some embodiments, such as illustrated, lid 155 may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

Figure 2A:
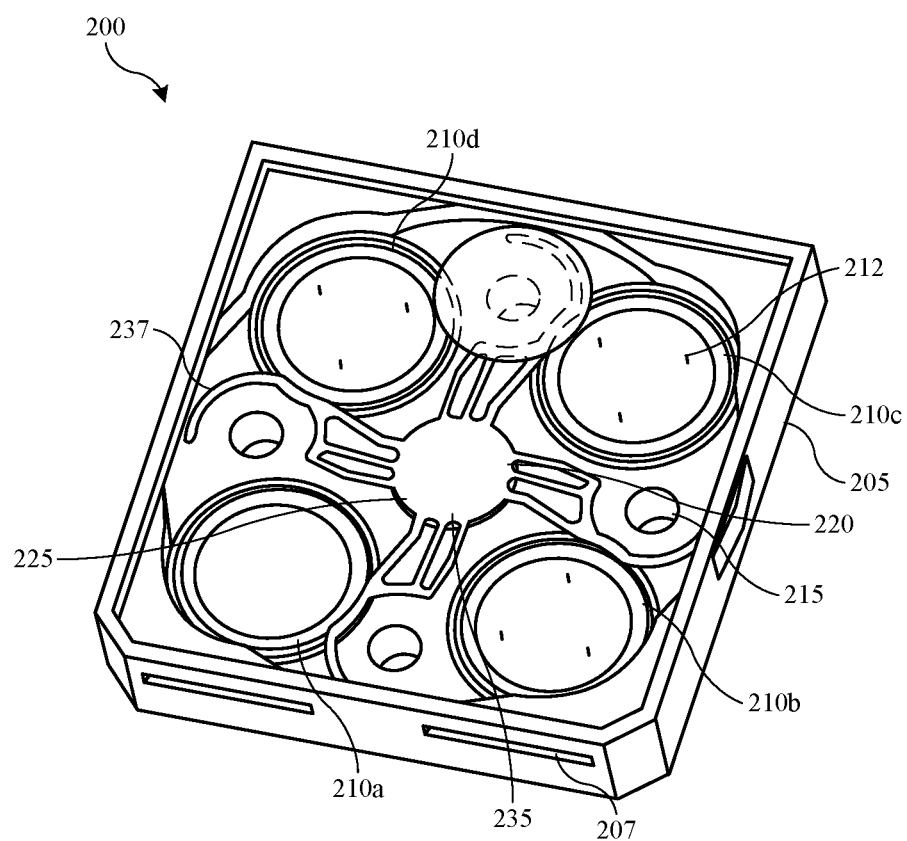
FIG. 2A shows a schematic isometric view of a transfer region of an exemplary chamber system according to some embodiments of the present technology.

As noted, processing system 100, or more specifically quad sections or chamber systems incorporated with processing system 100 or other processing systems, may include transfer sections positioned below the processing chamber regions illustrated. FIG. 2A shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer region. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 2B:
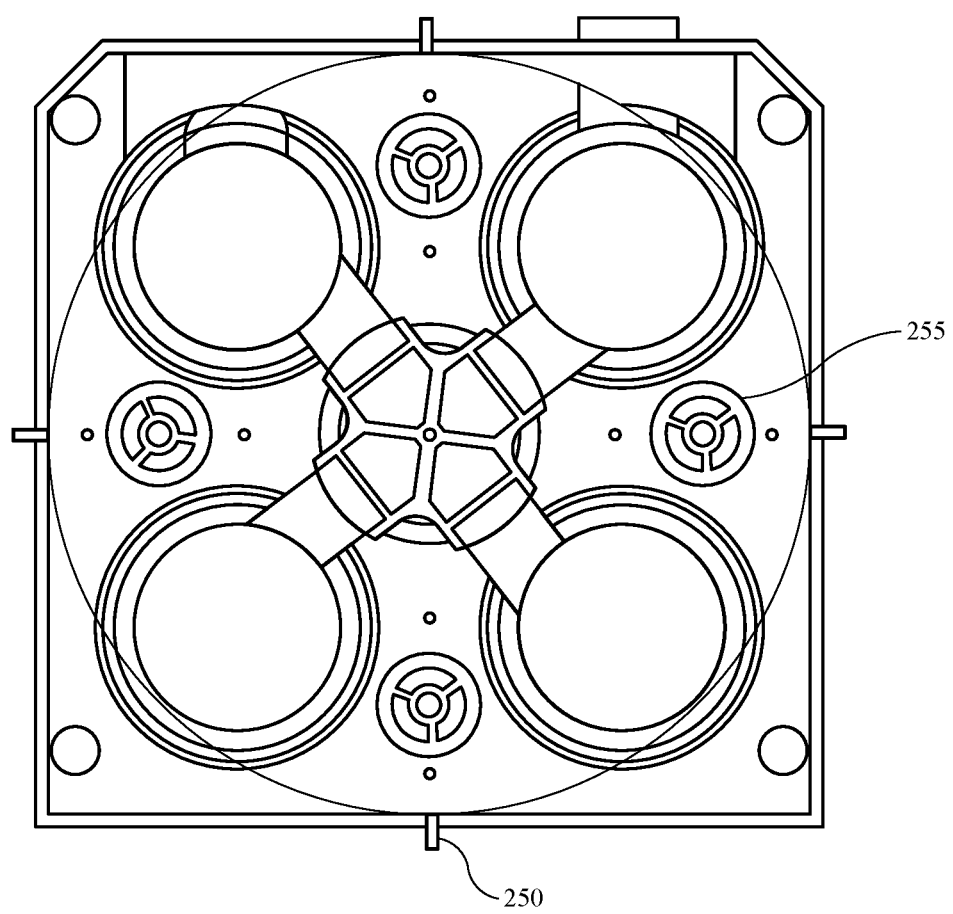
FIG. 2B shows a schematic top plan view of a transfer region of an exemplary chamber system according to some embodiments of the present technology.

FIG. 2B shows a schematic top plan view of a transfer region of an exemplary chamber system according to some embodiments of the present technology. The figure may include additional components that may be incorporated with the transfer region of the processing system. For example, although aligners may be included through accesses 215 through the transfer region housing 205, additional components may also be incorporated. As previously noted, one or more processing regions may be formed overlying the transfer region housing in some embodiments. While fluidly coupled with the transfer region of the system, the transfer region may be relatively isolated in the system, and may be substantially purged, to provide a clean environment within which one or more parameters may be characterized.

For example, in some embodiments, through apertures 215 may be in-chamber measurement locations where one or more metrological characterizations may be made. Optical characterization may include one or more of reflectance measurements, interference measurements, and polarization measurements. Exemplary optical setups may direct one or more light sources 250 to impinge either angled or normal to a surface on the substrate, and imaging or non-imaging light collection may be performed by the detectors 255 of an incorporated detection system. Depending on the characteristics of the transfer apparatus, and the available motions of a substrate, multi-point measurements may be performed with rotational measurements along an azimuth of the substrate and/or sweep measurements across a radial position across the substrate as the substrate may be swept across the detector. As illustrated, a light source 250 or laser may extend through the transfer region housing 205 at each position between substrate supports, and direct the optical source at substrates in transit. The light source may be continuous or variably intensity, and may operate at single or multiple wavelengths in some embodiments. Additionally, the sweep and rotation may occur at different substrate elevations by adjusting the transfer apparatus or utilizing multiple angled receivers. Noise-suppression may be incorporated with code-division multiplexing, such as through modulation, of the optical signal, followed by decoding of the collected optical signal, which may enable increased signal-to-noise ratios.

Figure 3:
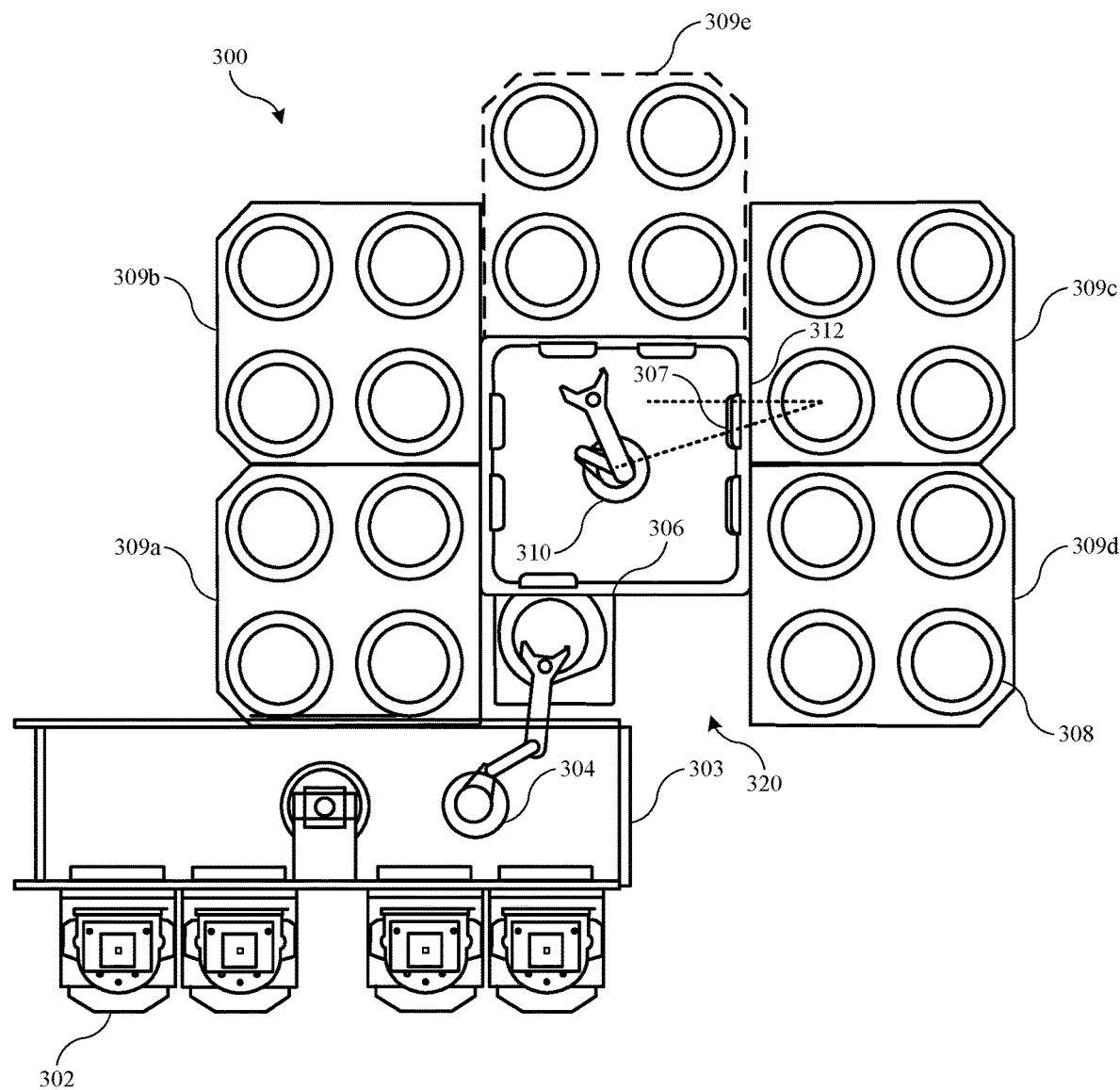
FIG. 3 shows a schematic top plan view of an exemplary processing system according to some embodiments of the present technology.
Figure 4:
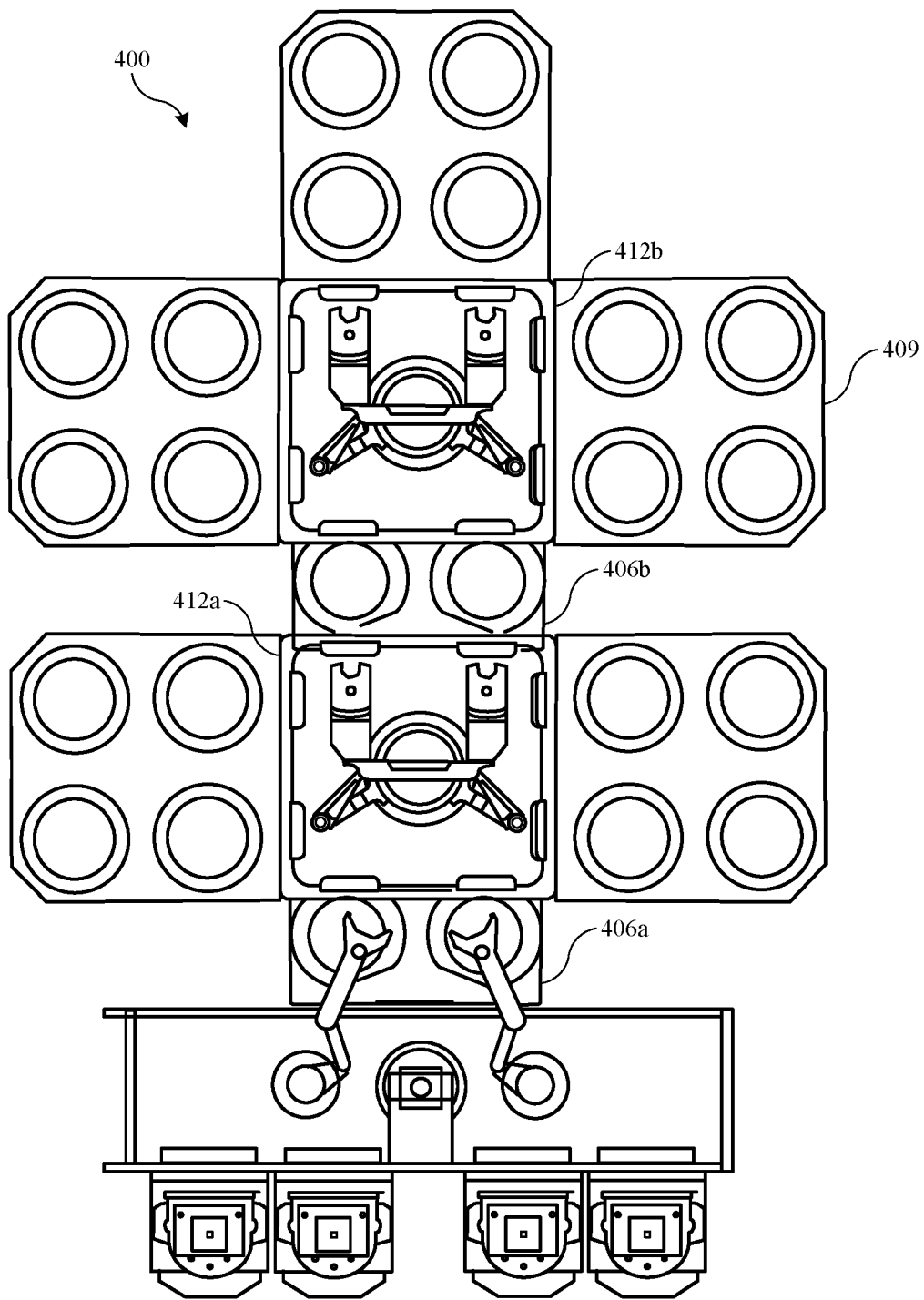
FIG. 4 shows a schematic top plan view of an exemplary processing system according to some embodiments of the present technology.
Figure 5:
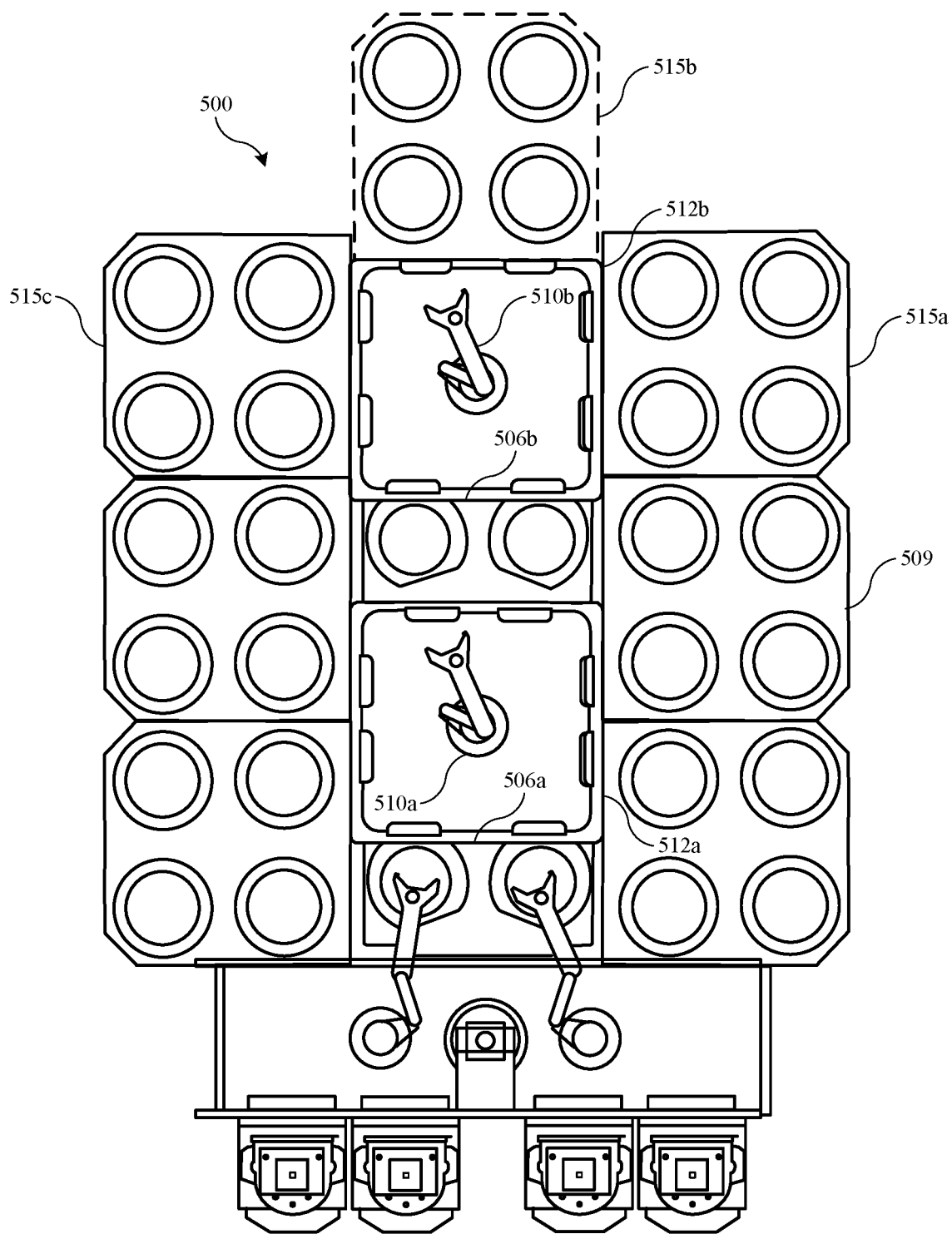
FIG. 5 shows a schematic top plan view of an exemplary processing system according to some embodiments of the present technology.

The present technology may produce a number of cluster tool configurations that may afford increased processing capacity within a controlled footprint. FIGS. 3-5 illustrate exemplary substrate processing system configurations and variations encompassed by the present technology, which may modify certain positioning relative to FIG. 1, in some embodiments. The described processing systems are not to be considered limiting, and are intended to describe a few of a variety of configurations and adjustments that may be made to produce cluster tools that may increase a number of processing regions within a designated footprint. Depending on dimensional constraints for a cluster tool, the present technology may provide for multiple adjustments and configurations to accommodate length constraints on the system. Many other modifications according to the described adjustments may similarly be made to further expand cluster tools beyond the configurations illustrated, and are similarly encompassed by the present technology.

FIG. 3 shows a schematic top plan view of one embodiment of an exemplary processing system 300 according to some embodiments of the present technology. System 300 may include some or all of the components of system 100 described above, and may also include variations on the number of chamber systems coupled with the transfer chamber in some embodiments. For example, system 300 may include a number of front-opening unified pods 302 for providing substrates into the processing system, or cluster tool. One or more robots, such as robot 304, may be housed in a factory interface of the processing system, and may retrieve substrates from and deliver substrates to the pods 302. Robots 304 may also deliver substrates into a load lock 306, coupled at an opposite side of the factory interface as illustrated. The load lock 306 may include access on each side for transferring substrates between the factory interface, and the controlled processing environment.

The illustration also includes a variation with the factory interface and/or load lock chamber, which may be incorporated into any of the designs or configurations described elsewhere. In some embodiments, a single load lock chamber 306 may be included with the tool. Additionally, in some embodiments the factory interface 303 may be laterally offset from center in either direction. This offset and/or single load lock chamber may provide a service access 320 through which the transfer chamber 312 may be accessed or serviced. Although illustrated with a single robot 304 in the factory interface, in some embodiments multiple robots may be included as previously described, which may transfer substrates to one another for delivery to or from the pods 302 as well as the load lock 306.

A transfer chamber 312 may be coupled with the opposite side of the load lock 306 from factory interface 303, and may house a transfer chamber robot 310 as illustrated. Robot 310 may include each of the characteristics and functionalities described above for transfer chamber robots, and robot 310 may be configured to deliver substrates to and retrieve substrates from each of the chamber systems 309 distributed about the transfer chamber. Chamber systems 309 may include any of the components, characteristics, and materials of chamber systems or quad sections described above, which may include a transfer region including a transfer apparatus, and overlying processing regions 308 as previously described. FIG. 3 may illustrate a variation in which additional chamber systems may be accessible about the transfer chamber by reducing the number of accesses for each chamber system.

For example, while system 100 illustrated quad sections laterally aligned with each face of the transfer chamber, system 300 may offset each chamber system 309 to align a single access 307 of each chamber system 309 with the transfer chamber 312. Consequently, in such a configuration, four chamber systems 309a, 309b, 309c, 309d, may be positioned along two opposite faces of transfer chamber 312. While two chamber accesses may still be accessible along each surface of transfer chamber 312, in the illustrated configuration, each access may be associated with a different chamber system 309. Chamber systems 309 may still include two accesses along a surface of the transfer chamber as previously described, which may maximize hardware modulation to afford multiple configurations, although in some embodiments the chamber systems 309 may include only a single access 307, or may position only a single access 307 to be accessible to robot 310.

The access 307 of each chamber system 309 may be at least partially aligned with a first substrate support within a transfer region of a chamber system as previously described. In some embodiments robot 310 may be a dual-bladed robot as previously described, which may include two arms for delivering two substrates at a time. Hence, for chamber systems 309a and 309b, the robot 310 may simultaneously deliver a substrate into each chamber system through the single access 307 of each chamber system. The robot may deliver substrates similarly into chamber systems 309c and 309d. Chamber system 309e may optionally be included in processing system 300, or may be excluded in some embodiments to further reduce a footprint of the processing system. Chamber system 309e may have a configuration similar to chamber systems described previously for system 100. For example, chamber system 309e may include two accesses aligned with two substrate supports, which may be accessible to robot 310 for dual-substrate delivery as discussed previously.

While chamber system 300 may include a dual-bladed robot as described, in some embodiments the chamber system 300 may include a single-bladed robot 310, as illustrated, which may deliver a single substrate to processing regions at any particular time. Additionally, the robot may include three blades, four blades, or six blades, in some embodiments in which for the illustrated configuration a full delivery or retrieval of substrates may be performed in a single operation. Because chamber systems may be taken down for maintenance, when dual-bladed robots as described above are utilized, a second chamber system may also become inaccessible. Accordingly, a single-bladed robot or a robot with one arm may be used, which may allow each other chamber system to be accessible at any time. Other configurations may similarly be encompassed by the present technology including vertically offset blades on a single robot, or vertically offset robots, such as including one inverted robot. While these robots may handle two or more substrates within the transfer chamber at a time, they may deliver or retrieve a single substrate at a time into each chamber system 309.

Additionally, because of the chamber configurations and offset as illustrated, when a robot 310 with a single arm is used, the robot may be centrally located within the transfer chamber 312, which may or may not accommodate direct delivery into any individual chamber system. For example, while in some embodiments robot 310 may deliver a substrate directly or linearly into a chamber system, in some embodiments the robot may extend through one or more of the accesses 307 at an angle other than perpendicular to a plane along the access. As illustrated in chamber system 309c, delivery through the access to the available substrate support may occur perpendicular to a face of the chamber system, or may occur at an angle offset from perpendicular as illustrated, depending on the configuration of the robot. Accordingly, in some embodiments, robot 310 and/or accesses 307 may be sized or positioned to afford angled access into the transfer region. For example, accesses 307 may be sized larger than for linear access, or may be offset from a direct alignment with the substrate support to accommodate a delivery trajectory of the robot 310. By adjusting the chamber systems about a transfer chamber of the processing system, the present technology may increase a number of accessible processing regions without additional transfer robots, and in a space efficient way.

FIG. 4 shows a schematic top plan view of one embodiment of an exemplary processing system 400 according to some embodiments of the present technology. FIG. 4 may illustrate an exemplary system extending the platform described above for FIG. 1. System 400 may include any of the components or configurations described above for system 100 or system 300. System 400 may illustrate a system including dual load locks 406 and dual transfer chambers 412, which may increase the number of directly aligned chamber systems 409 that may be incorporated onto the cluster tool or processing system. For example, by removing chamber system 109b, an additional load lock 406, which may also be a pass through, may be included in the system, which may be on an opposite face of transfer chamber 412a from load lock 406a. When a pass through is included, the transfer chambers may share a common environment with the pass through, whereas an additional load lock may isolate the two transfer chambers. Coupled with the opposite face of load lock 406b may be an additional transfer chamber 412b, which may provide access to additional chamber systems 409. It is to be understood that system 400 may include extensions along other directions as well, such as including additional load lock chambers along other faces of either transfer chamber 410, which may allow extending the system similarly in any other lateral direction.

FIG. 5 shows a schematic top plan view of one embodiment of an exemplary processing system 500 according to some embodiments of the present technology. FIG. 5 may illustrate an exemplary system extending the platform described above for FIG. 3. System 500 may include any of the components or configurations described above for system 100, system 300, or system 400. System 500 may also illustrate a system including dual load locks 506 and dual transfer chambers 510, which may increase the number of directly aligned chamber systems 509 that may be incorporated onto the cluster tool or processing system. System 500 may illustrate a more space efficient extension of the system, and may illustrate a combination of the processing systems described above. For example, a first set of chamber systems 509 may be incorporated with transfer chamber 512a, and offset similarly to the system configuration described above for system 300. Additionally, a second load lock 506b, or pass through, may be positioned on an opposite side of transfer chamber 512a from load lock 506a. A second transfer chamber 512b may be coupled with the opposite side of second load lock 506b, and which may provide access to chamber systems 515 in a configuration similar to system 100. Chamber systems 515a and 515c may further extend a direction of chambers, and chamber system 515b may optionally be included at an end position depending on lateral constraints on the system footprint in some embodiments.

Accordingly, in embodiments according to the present technology, any combination of chamber coupling may be included to further extend the system in a number of ways. Additionally, in the configuration illustrated, although a single-blade robot is illustrated for each of robots 510a and 510b, in some embodiments either or both robots may be a dual-bladed robot as previously described. As one non-limiting example, in some embodiments robot 510a may include one or more single-blade robots, and robot 510b may include a dual-bladed robot as previously described. Again, any number of other configurations or variations along these described embodiments are similarly encompassed by the present technology.

Figure 6:
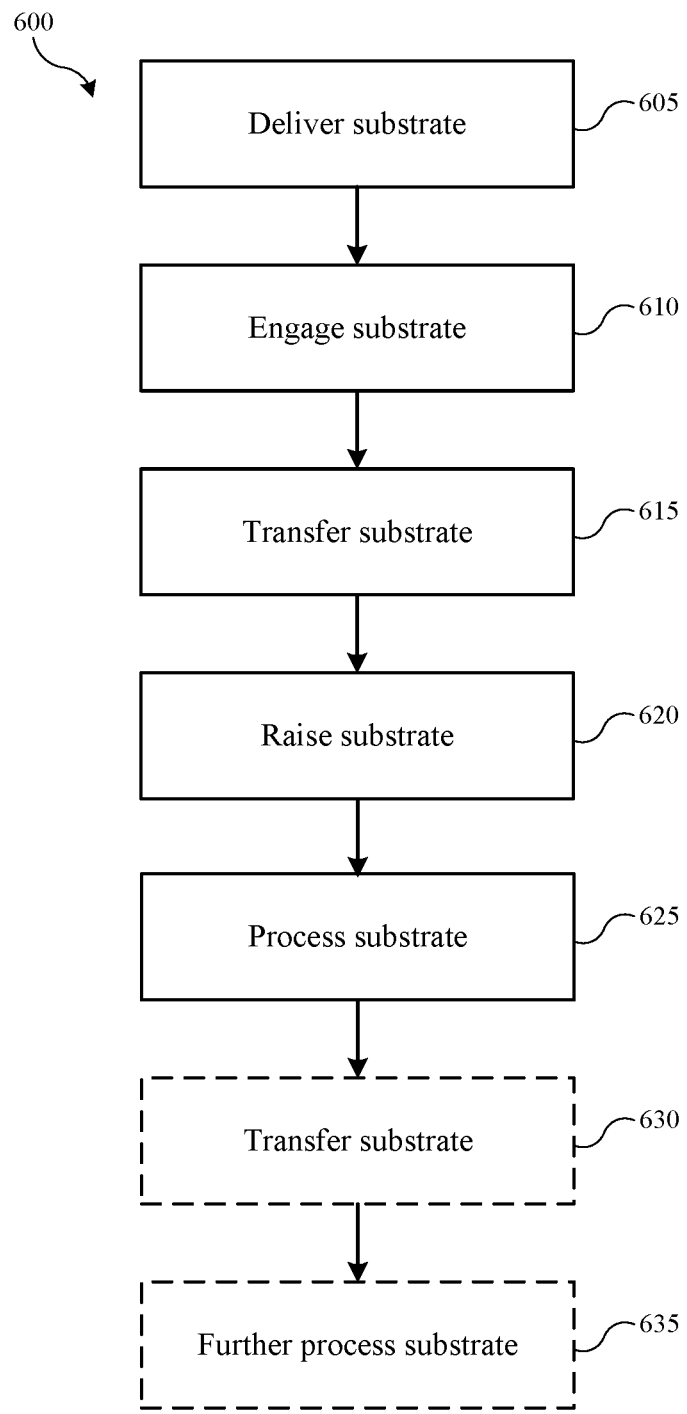
FIG. 6 shows exemplary operations in a method of processing substrates according to some embodiments of the present technology.

FIG. 6 shows exemplary operations in a method 600 of processing substrates according to some embodiments of the present technology. Method 600 may be performed in one or more processing systems, such as any system or component previously described, including any of the system configurations discussed above. The method may include a number of optional operations as denoted in the figure, which may or may not be specifically associated with some embodiments of methods according to the present technology. Method 600 describes operations shown schematically in FIGS. 7A-7E, the illustrations of which will be described in conjunction with the operations of method 600. It is to be understood that FIG. 7 illustrates only partial schematic views with limited details, and in some embodiments the systems may include more or less substrate supports and other components, as well as alternative structural aspects that may still benefit from any of the aspects of the present technology.

Figure 7A:
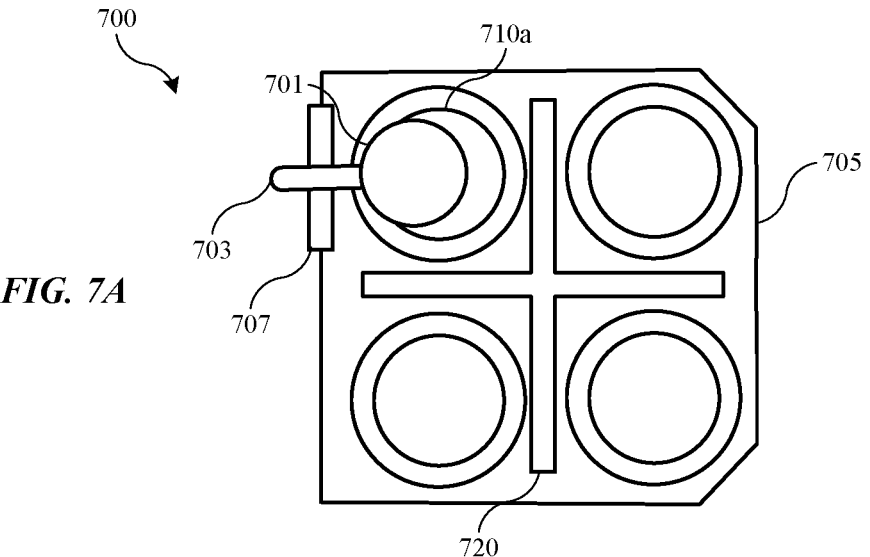
FIGS. 7A-7E show schematic views of a substrate being processed according to some embodiments of the present technology.

FIG. 7A may illustrate aspects of a chamber system 700 as previously described, and may include any of the features and aspects of chamber systems described above, including a transfer region and overlying processing regions, although the processing regions may not be visible in this view. The figure may show a configuration of the present technology during initial operations of method 600, which may include delivering a substrate 701 to a first substrate support 710a at operation 605, such as through an access 707 with a robot 703, such as any of the transfer chamber robots as previously described. Although illustrated as delivering a single substrate, the robot may deliver one or two, or more, substrates into the transfer region 705, and onto the substrate supports proximate the accesses or slit valves. It is to be understood that the same process can be performed with any number of substrates, including delivery of one substrate at a time into the transfer region. Transfer apparatus 720 may be rotatable about a central axis of the transfer apparatus, and may include a number of arms including a number equal to a number of substrate supports as described above.

Figure 7B:
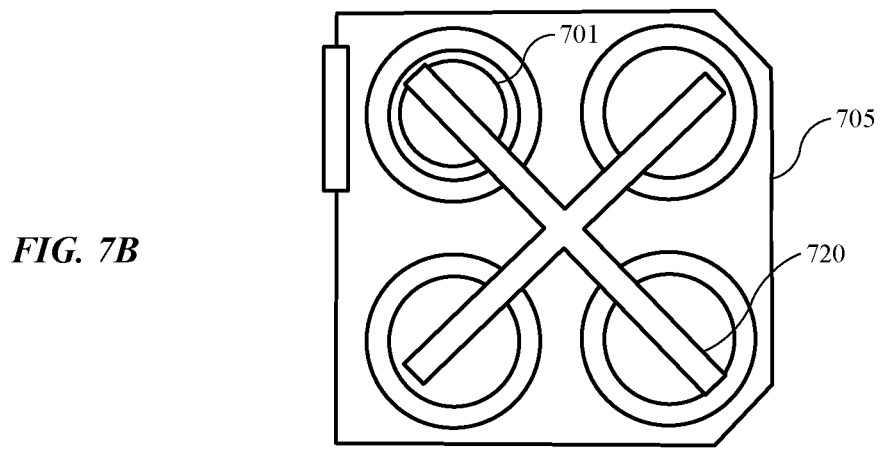
Figure 7C:
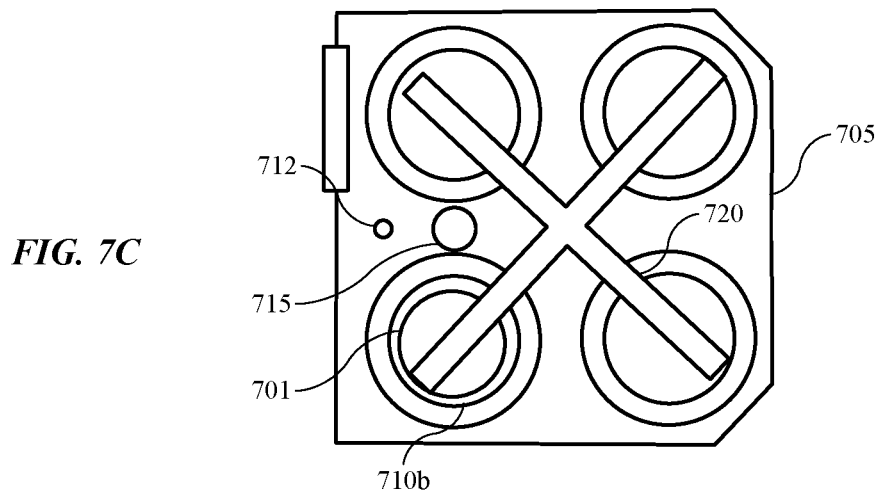

As illustrated in FIG. 7B, transfer apparatus 720 may be rotated within transfer region 705 to engage substrate 701 at operation 610. Depending on the aspects of an end effector of transfer apparatus 720, the substrate may be engaged above, below, or along edges of substrate 701 in various embodiments. Once engaged, substrate 701 may be repositioned or transferred to a second substrate support 710b within the transfer region 705 at operation 615, and as illustrated in FIG. 7C. Again, in embodiments the transfer apparatus may engage and/or transfer two, three, four, or any number of substrates in embodiments of the present technology. During the transfer, in some embodiments, an alignment operation may occur, in which a camera, laser, or other component may read or operate through aperture 712 to identify whether substrate 701 is properly aligned for processing. An additional aligner 715 may be used to reposition a substrate in some embodiments. For example, a substrate may be accepted by aligner 715, which may reposition the substrate in some embodiments. The substrate may then be recollected by transfer apparatus 720, and transferred to second substrate support 710b.

It is to be understood that the delivery may occur to any substrate support within the transfer region in embodiments, and the operations explained are intended to describe operations that may be performed, although the specific illustrations are not intended to limit the operations. Transfer apparatus 720 may further reposition substrate 710 prior to delivery to second substrate support 710b, which may include lateral repositioning of the substrate in some embodiments in which the transfer apparatus is configured to provide lateral movement in addition to rotational movement. Once properly positioned, transfer apparatus 720 may deliver the substrate to second substrate support 710b. The delivery may be by lowering the substrate with the transfer apparatus, or a component of the transfer apparatus, or in some embodiments the substrate support, including lift pins of the substrate support, may be raised to accept the substrate from the transfer apparatus, either of which deliveries may have the substrate support in a first position vertically within the chamber system.

Figure 7D:
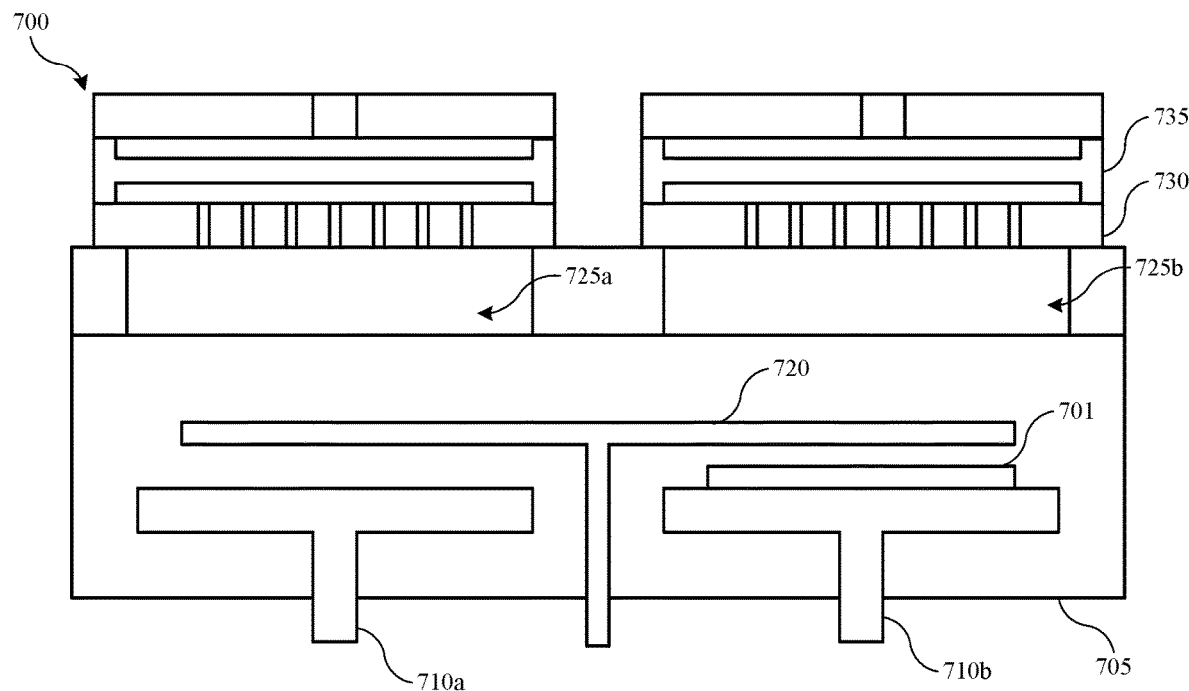

FIG. 7D may illustrate a cross-sectional elevation view through a chamber system 700, such as through substrate supports 710a and 710b, and overlying processing regions 725a and 725b. The chamber system and each processing region may include any of the components previously described, including a faceplate 730, a blocker plate 735, and lid components which may define access for delivering precursors into the individual processing regions. FIG. 7D may illustrate the elevation view after the substrate 701 has been transferred to second substrate support 710b within transfer region 705. Transfer apparatus 720 may be rotated away from the substrate supports, such as to a recessed position, which may be similar to the position illustrated in FIG. 7A, or any other position in which the end effector may not interfere with vertical translation of one or more of the substrate supports.

Figure 7E:
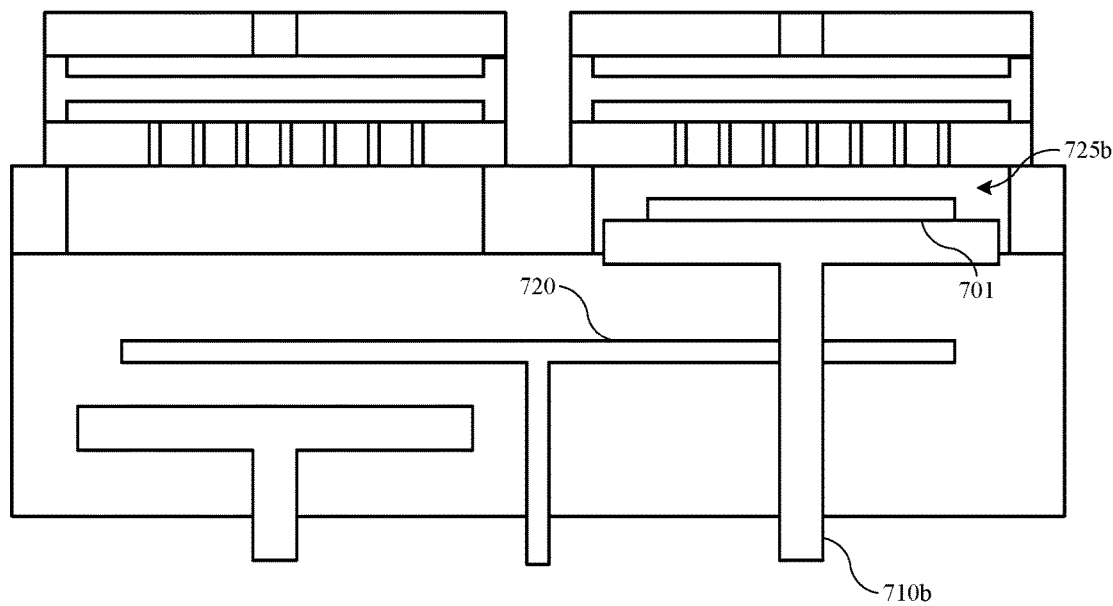

At operation 620, the second substrate support may be raised as illustrated in FIG. 7E, to deliver the substrate to processing region 725b for processing, which may position the substrate support at a second vertical position relative to the first. As illustrated, transfer apparatus 720 may not interfere or be contacted by the substrate support, which may extend vertically along a central axis of the substrate support to the overlying, and axially aligned processing region. When positioned for processing, substrate support 710b may at least partially define the substrate processing region from below, which may illustrate the fluid coupling between the individual processing regions and transfer region. At operation 625, substrate 701 may be processed in any number of processing operations that may be performed in processing regions according to the present technology, which may include, as one non-limiting example, depositing one or more layers of material on the substrate. In some embodiments substrate support 710b and faceplate 730 or other lid stack components may operate as electrodes to produce a plasma within processing region 725b. The substrate supports may also be configured to heat the substrates as previously described. Although illustrated as a single substrate being processed, it is to be understood that any number of substrates may be simultaneously processed, including a substrate on each substrate support within the chamber system. Each of the substrate supports may be configured for similar operation as substrate support 710b as described.

Method 600 may optionally include additional processing in additional processing regions of the chamber system. For example, in optional operation 630, substrate 701 may be rotated or transferred to any of the other substrate supports within the chamber system. This transfer may include lowering the substrate with substrate support 710b back to the first position, which may be below transfer apparatus 720, and may allow the transfer apparatus to re-engage the substrate at the second substrate support. In some embodiments the operation may include lowering and transferring all substrates in the system. The substrate or substrates may then be transferred to any other substrate support in the system, either for retrieval by a robot from a transfer chamber, or for further processing.

When further processing is being performed, the substrate may be transferred to a third substrate support within transfer region 720, and which may be any of the substrate supports illustrated previously, including first substrate support 710a in some embodiments. The third substrate support may then be raised into an associated processing region similarly to that described above. The substrate may then be further processed at optional operation 635. In some embodiments the subsequent processing may also include depositing one or more layers of material on the substrate, or may include any other processing operations. While transfer region 705 may be open among the substrates and transfer apparatus, the processing regions may be at least partially isolated from one another as illustrated, and may be fluidly isolated from above from each other processing region.

The present technology includes substrate processing systems that may accommodate additional substrate supports that may not otherwise be accessible to centrally located transfer robots as previously described. By incorporating transfer apparatuses according to embodiments of the present technology, multiple substrate supports may be utilized and accessed during substrate processing. Additionally, by incorporating chamber systems in any of the configurations described throughout the present disclosure, a limited footprint may be maximized to incorporate a number of different chamber configurations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a substrate" includes a plurality of such substrates, and reference to "the arm" includes reference to one or more arms and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate processing system comprising:
a factory interface;
a load lock coupled with the factory interface;
a transfer chamber coupled with the load lock, wherein the transfer chamber comprises a robot configured to retrieve substrates from the load lock; and
a chamber system positioned adjacent to and coupled with the transfer chamber, the chamber system comprising:
a transfer region laterally accessible to the robot, wherein the transfer region comprises:
a plurality of substrate supports disposed about the transfer region, each substrate support of the plurality of substrate supports vertically translatable along a central axis of the substrate support between a first position and a second position,
a transfer apparatus rotatable about an additional central axis and configured to engage the substrates and transfer the substrates among the plurality of substrate supports, and
a plurality of processing regions vertically offset from the transfer region, each processing region of the plurality of processing regions axially aligned with an associated substrate support of the plurality of substrate supports, wherein each processing region of the plurality of processing regions is defined from below by an associated substrate support in the second position;
wherein the transfer apparatus comprises an end effector having a plurality of arms being positionable in a recessed position in which the end effector does not interfere with vertical translation of the plurality of substrate supports; and
wherein the second position is vertically above the end effector.

2. The substrate processing system of claim 1, wherein the plurality of substrate supports within the transfer region of the chamber system comprises at least four substrate supports.

3. The substrate processing system of claim 1, wherein each processing region of the plurality of processing regions is fluidly coupled with the transfer region and fluidly isolated from above from each other processing region of the plurality of processing regions.

4. The substrate processing system of claim 1, further comprising at least two additional chamber systems positioned adjacent and coupled with the transfer chamber.

5. The substrate processing system of claim 4, wherein each chamber system defines two accesses along a surface of a housing of the transfer region adjacent the transfer chamber, wherein a first access of the two accesses is aligned with a first substrate support of the plurality of substrate supports, and wherein a second access of the two accesses is aligned with a second substrate support of the plurality of substrate supports.

6. The substrate processing system of claim 5, wherein the robot comprises two arms configured to deliver or retrieve a first substrate from the first substrate support through the first access and simultaneously deliver or retrieve a second substrate from the second substrate support through the second access.

7. The substrate processing system of claim 1, further comprising at least three additional chamber systems positioned adjacent and coupled with the transfer chamber.

8. The substrate processing system of claim 7, wherein each chamber system defines one access along a surface of a housing of the transfer region adjacent the transfer chamber, wherein the one access is aligned with a first substrate support of the plurality of substrate supports.

9. The substrate processing system of claim 8, wherein the robot comprises one arm configured to deliver or retrieve a substrate from the first substrate support through the one access.

10. The substrate processing system of claim 9, wherein the one arm of the robot extends through the one access of each chamber system at an angle other than perpendicular to the one access.

11. The substrate processing system of claim 1, wherein the chamber system is offset from the transfer chamber such that at least one of the plurality of processing regions is laterally outward of a boundary of the transfer chamber in two orthogonal directions.

12. The substrate processing system of claim 1, further comprising an additional chamber system, wherein the chamber system and the additional chamber system are disposed about a same side of the transfer chamber, with a center of the chamber system and a center of the additional chamber system each being laterally offset from a center of the transfer chamber.

13. The substrate processing system of claim 1, wherein the transfer region defines an access through which a light source is disposed.

14. The substrate processing system of claim 1, wherein the transfer region defines an access through which an aligner is disposed.

* * * * *